United States Patent
Lu et al.

(10) Patent No.: US 7,113,392 B2
(45) Date of Patent: Sep. 26, 2006

(54) INTEGRATED MECHANICAL STANDOFF AND WALL-MOUNT APPARATUS

(75) Inventors: Torence Lu, Fremont, CA (US); George Youzhi Yi, Fremont, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 10/961,773

(22) Filed: Oct. 7, 2004

(65) Prior Publication Data
US 2006/0077647 A1    Apr. 13, 2006

(51) Int. Cl.
*H05K 7/14* (2006.01)

(52) U.S. Cl. ................. 361/679; 361/818; 385/137; 439/928.1

(58) Field of Classification Search ............ 361/796, 361/818, 801, 807, 809–810, 679–687, 724–727; 248/201; 385/134–135, 137; 439/928.1
See application file for complete search history.

(56) References Cited

U.S. PATENT DOCUMENTS

| 6,191,953 B1 * | 2/2001 | Aggus et al. ............... 361/796 |
| 6,510,055 B1 * | 1/2003 | Liu et al. .................... 361/724 |
| 6,879,496 B1 * | 4/2005 | Marshall et al. ........... 361/818 |

* cited by examiner

*Primary Examiner*—Hung Van Duong
(74) *Attorney, Agent, or Firm*—Sierra Patent Group, Ltd

(57) ABSTRACT

An integrated standoff and wall mount apparatus is disclosed. A standoff is formed in the inner surface of a chassis backplane of an electrical device and comprises a conical shape extending generally upward from the inner surface of the chassis backplane. The integrated standoff is used to secure a PCB to the chassis. A keyhole feature may be formed in the surface of both said standoff and said chassis backplane for wall mounting the device. The keyhole feature includes an opening and a groove. A tongue-shaped coverplate is provided that extends from the standoff and provides safety features by covering the keyhole feature. The integrated standoff may be used to wall mount the device using a wall mount fastener secured in the keyhole.

5 Claims, 4 Drawing Sheets

INTEGRATED MECHANICAL STANDOFF AND WALL-MOUNT APPARATUS

BACKGROUND

1. Field of the Disclosure

The disclosure relates generally to the assembly and mounting of electronic equipment.

THE PRIOR ART

2. Background

Typically, modern electronic devices are formed by securing components such as printed circuit boards (PCBs), connectors and the like to a metal chassis such as a back plate. To facilitate the attachment of components such as a PCB to the chassis, typically standoffs are formed in the chassis to allow the securing of the PCB through the use of fasteners such as screws or rivets.

Furthermore, many devices are intended to either be used by the customer either on a flat surface such as a table or desktop, or wall mounted. To facilitate the mounting of devices on a vertical surface such as a wall, typically key-hole shaped features are formed in the chassis backplane.

Hence, the chassis of a device may include multiple standoffs for mounting various components to the backplane, and additionally incorporate multiple mounting keyholes as well.

Moreover, various safety codes and regulations may require that voids formed in a chassis backplane include a cover to prevent material from exiting the device into the customer's environment. For example, fire codes may require that voids in consumer devices include covers to prevent burning components from falling from the device and spreading a fire to the surrounding environment.

To comply with such directives, typically cover plates must be provided for every keyhole or other mounting feature provided in the backplane. This requires that a separate cover plate be formed and fastened to the chassis for each mounting feature provided.

Hence, for each mounting feature provided, additional holes, cover plates, and fastening hardware such as rivets must be provided.

BRIEF DESCRIPTION OF THE DRAWING FIGURES

DETAILED DESCRIPTION

Figure 1:
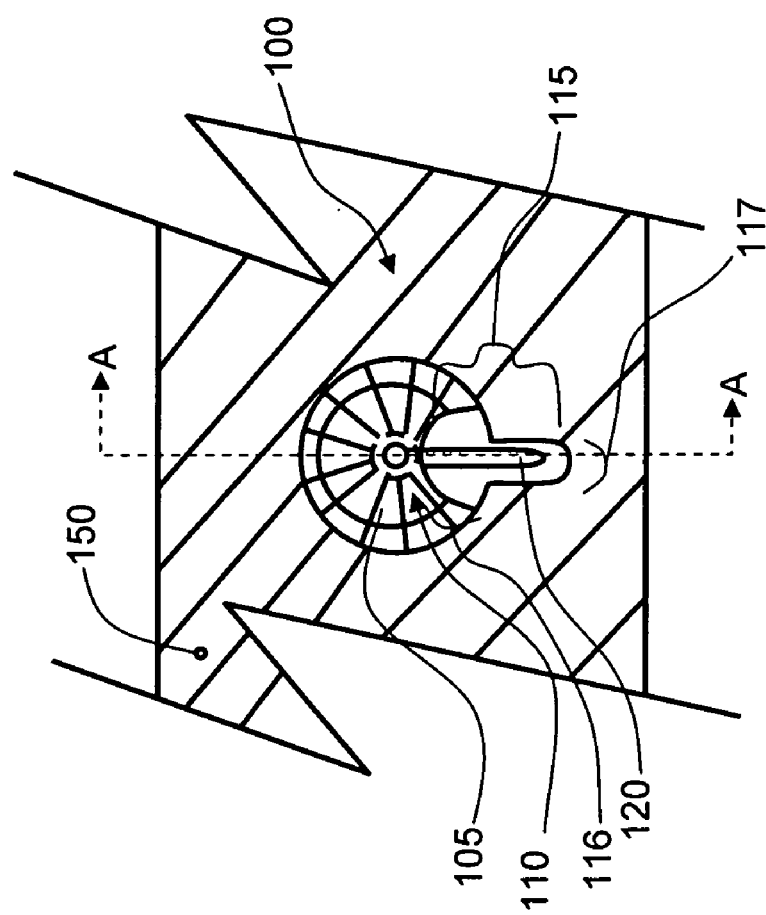
FIG. 1 is a top view of an integrated standoff and wall mount apparatus in accordance with the teachings of this disclosure.

Persons of ordinary skill in the art will realize that the following description is illustrative only and not in any way limiting. Other modifications and improvements will readily suggest themselves to such skilled persons having the benefit of this disclosure. In the following description, like reference numerals refer to like elements throughout.

FIG. 1 is a top view of one embodiment of an integrated standoff and wall mount apparatus 100 configured in accordance with the teachings of this disclosure. FIG. 1 shows a single integrated standoff 100 being formed in a chassis backplane though it is to be understood that any number of integrated standoffs may be formed in a backplane in accordance with this disclosure as desired.

The integrated standoff 100 comprises a generally conical body 105 including a fastener receptacle 110 for receiving conventional fasteners such as screws, rivets, and the like.

The integrated standoff 100 also includes a keyhole feature 115 configured to provide a wall mount feature for the chassis backplane 150 and associated equipment. It can be seen from FIG. 1 that the keyhole feature 115 is formed in both the conical body 105 of the integrated standoff 100 and the chassis backplane 150. In other words, a portion of the keyhole feature 115 is formed in the conical body 105, and portion formed in the chassis backplane 150. As can be appreciated from FIG. 1, the keyhole feature 115 extends in a generally latitudinal direction outward from the integrated standoff into the chassis 150.

FIG. 1 also shows that the keyhole feature 115 may generally be described as having an opening 116 formed in the body 105, and a groove 117 formed in the chassis 150.

The integrated standoff 100 also includes a tongue-shaped coverplate 120 for covering a portion of the keyhole feature 115.

Figure 2:
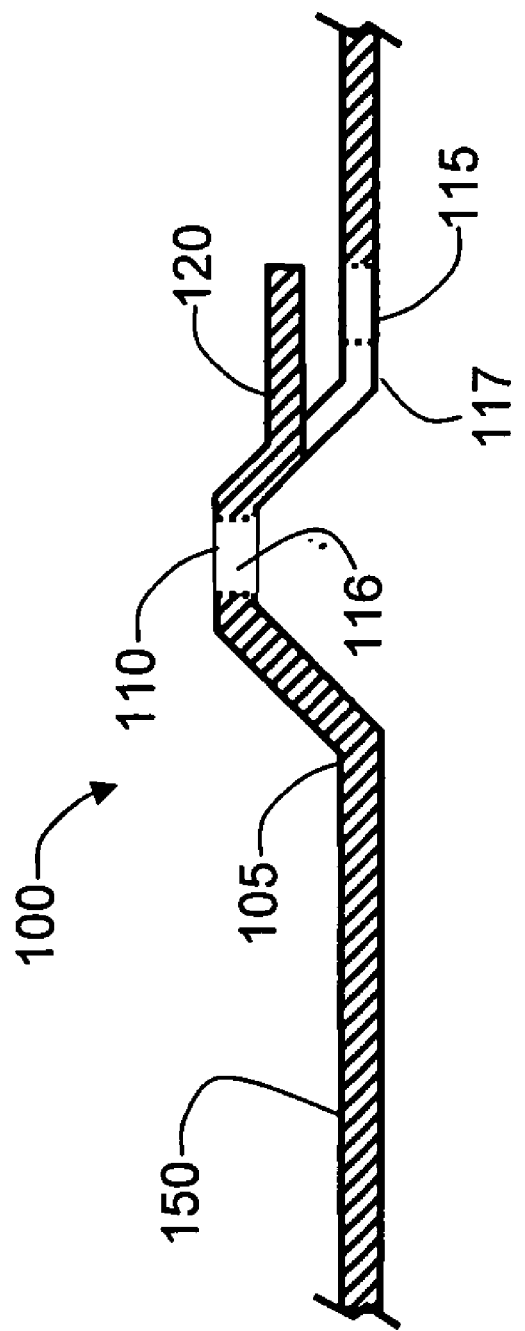
FIG. 2 is a cross sectional view of an integrated standoff and wall mount apparatus in accordance with the teachings of this disclosure.

FIG. 2 is a cross-section of the integrated standoff 100 taken along section A of FIG. 1. FIG. 2 shows that the conical body 105 is formed from the material of chassis backplane 150, with the base of the body 105 extending generally upward from the chassis 150 terminating with the fastener receptacle 110 being formed in the top surface of the body 105. It will be appreciated that the standoff of this disclosure may comprise shapes other than a conical shape.

FIG. 2 also shows that the tongue shaped coverplate 120 extends over the keyhole feature 115 in a generally parallel fashion to the surface of the chassis backplane 150. Additionally, it will be appreciated that the coverplate 120 may be formed from material from both the body 105 of the integrated standoff 100 and the base chassis 150.

Figure 3:
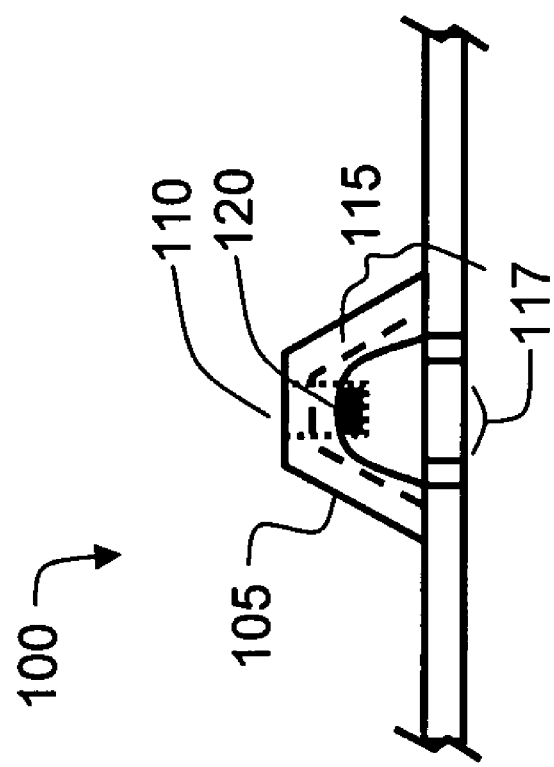
FIG. 3 is a front view of an integrated standoff and wall mount apparatus in accordance with the teachings of this disclosure.

FIG. 3 is a front view of an integrated standoff 100, showing the generally conical body 105 including a fastener receptacle 110, the tongue shaped coverplate 120 extending over the keyhole feature 115.

FIG. 3 also shows the front view of the keyhole feature 115, including the opening 116 formed in the body 105, and the groove 117 formed in the chassis 150.

Figure 4:
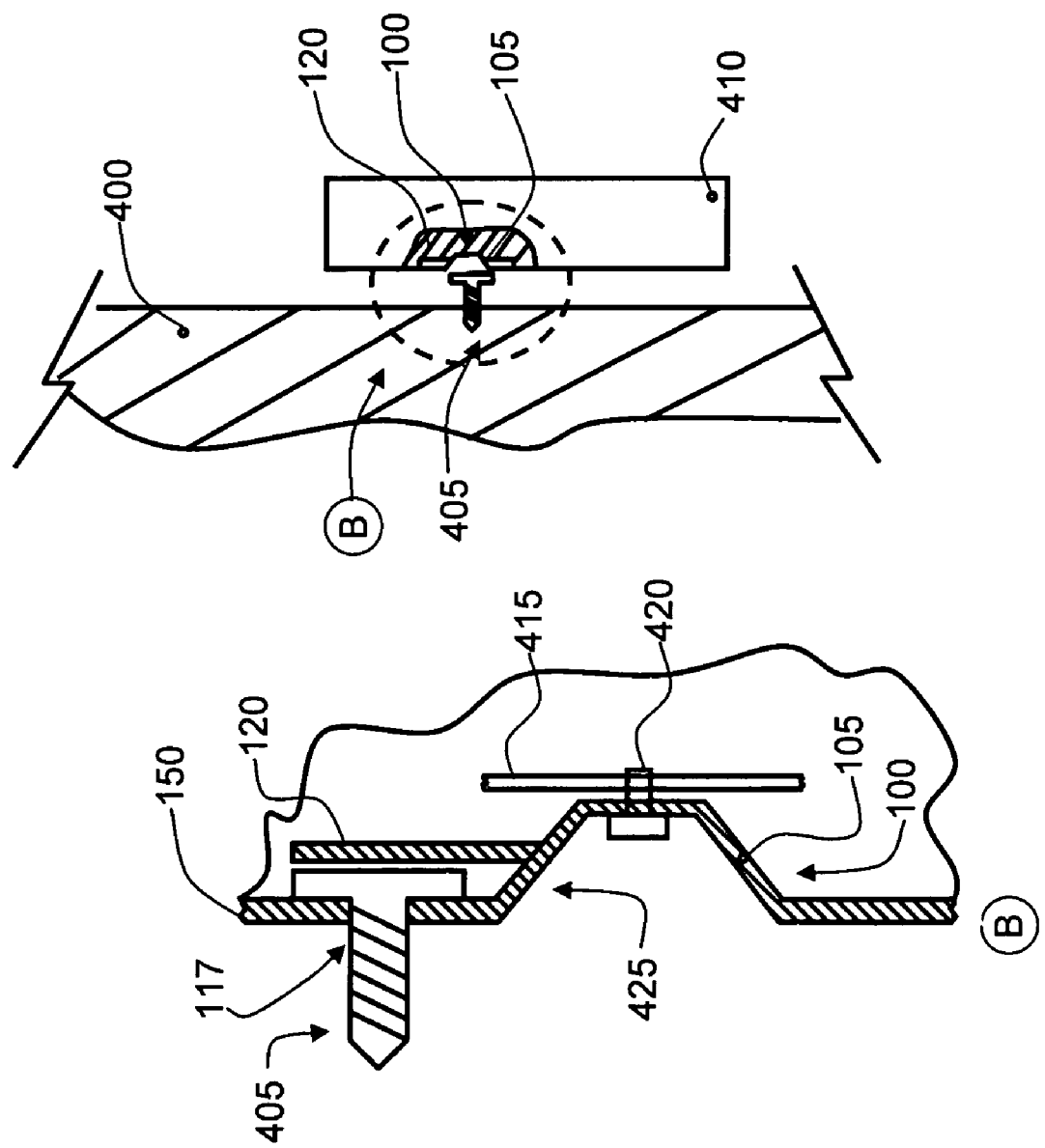
FIG. 4 is an illustration showing a cross-section of an integrated standoff and wall mount apparatus being used to wall mount a device in accordance with the teachings of this disclosure.

FIG. 4 shows an integrated standoff 100 being used in a user's environment. FIG. 4 shows an electrical device 410 being mounted on a wall 400 using a screw 405.

Detail section B shows the device 410 may be wall mounted using screw 405 and integrated standoff by inserting the screw 405 into the standoff through path 425 into the conical body 105, and securing the screw in the groove 117 of the wall mount feature. FIG. 4 also shows that the tongue shaped coverplate 120 extends over the wall mount screw and protects against extraneous material from entering or leaving the device 410.

Detail B of FIG. 4 also shows that the PCB 415 of the device 410 may also be secured to the chassis 150 through the use of a fastener 420 secured in the top of the integrated standoff 100.

As can be seen from the foregoing description, the integrated standoff of this disclosure provides for a dual function wall mount apparatus that eliminates the need for separate chassis and wall mount features in an electrical device, while complying with applicable safety standards. Thus, two needs are satisfied in a single integrated standoff that resolves separate needs in a single device.

While embodiments and applications of this disclosure have been shown and described, it would be apparent to those skilled in the art that many more modifications and improvements than mentioned above are possible without departing from the inventive concepts herein. The disclosure, therefore, is not to be restricted except in the spirit of the appended claims.

What is claimed is:

1. An integrated standoff and wall mount apparatus comprising:
   a standoff formed in the inner surface of a chassis backplane, said standoff extending generally upward from the inner surface of said chassis backplane wherein said standoff further comprises a fastener receptacle formed in the top of said standoff for affixing a printed circuit board to said chassis backplane;
   a keyhole feature formed in the surface of both said standoff and said chassis backplane, said keyhole feature including an opening and a groove extending in a generally latitudinal direction from said standoff into said chassis backplane; and
   a tongue-shaped coverplate extending from said standoff, said tongue-shaped coverplate extending over the portion of said keyhole feature formed in said chassis backplane substantially parallel to said chassis backplane wherein said tongue-shaped coverplate is configured to prevent extraneous material from entering or leaving an electrical device.

2. The integrated standoff of claim 1, wherein said keyhole feature is configured to receive a wall mount fastener, and allow an electrical device to be wall-mounted.

3. An integrated standoff and wall mount apparatus comprising:
   standoff means formed in the inner surface of a chassis backplane, said standoff extending generally upward from the inner surface of said chassis backplane wherein said standoff means further comprises a fastener receptacle means formed in the top of said standoff for affixing a printed circuit board to said chassis backplane;
   keyhole means formed in the surface of both said standoff and said chassis backplane, said keyhole means including an opening and a groove extending in a generally latitudinal direction from said standoff into said chassis backplane; and
   coverplate means extending from said standoff, said coverplate means extending over the portion of said keyhole feature formed in said chassis backplane substantially parallel to said chassis backplane wherein said coverplate means is configured to prevent extraneous material from entering or leaving an electrical device.

4. The integrated standoff of claim 3, wherein said keyhole means is configured to receive a wall mount fastener, and allow an electrical device to be wall-mounted.

5. An electrical device comprising:
   a chassis backplane;
   a printed circuit board;
   an integrated standoff for affixing said chassis backplane and said printed circuit board together;
   said integrated standoff comprising:
   a generally conical shape being formed upward from the inner surface of said chassis backplane;
   a fastener receptacle formed in the top of said standoff and configured to receive a fastener for affixing a printed circuit board to said chassis backplane;
   a keyhole feature formed in the surface of both said standoff and said chassis backplane, said keyhole feature including an opening and a groove extending in a generally latitudinal direction from said standoff into said chassis backplane;
   a tongue-shaped coverplate extending from said standoff, said tongue-shaped coverplate extending over the portion of said keyhole feature formed in said chassis backplane substantially parallel to said chassis backplane; and
   said keyhole feature being configured to receive a wall mount fastener, thereby allowing said electrical device to be wall-mounted.

* * * * *